(12) United States Patent
Gibson et al.

(10) Patent No.: US 10,074,218 B1
(45) Date of Patent: Sep. 11, 2018

(54) 3D CONTENT CREATION TOOL WITH AUTOMATIC MATING

(71) Applicant: Dassault Systemes SolidWorks Corporation, Waltham, MA (US)

(72) Inventors: Mark Gibson, Cambridge, MA (US); Amit Mandloi, Acton, MA (US); Hailong Li, Acton, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 710 days.

(21) Appl. No.: 14/579,659

(22) Filed: Dec. 22, 2014

Related U.S. Application Data

(60) Provisional application No. 61/920,133, filed on Dec. 23, 2013.

(51) Int. Cl.
*G06T 19/20* (2011.01)
*G06F 3/0481* (2013.01)
*G06F 3/0484* (2013.01)

(52) U.S. Cl.
CPC .......... *G06T 19/20* (2013.01); *G06F 3/04815* (2013.01); *G06F 3/04842* (2013.01); *G06F 3/04845* (2013.01); *G06T 2200/24* (2013.01); *G06T 2210/04* (2013.01); *G06T 2219/2008* (2013.01)

(58) Field of Classification Search
CPC .................................. G06F 3/011; G06T 11/00
See application file for complete search history.

(56) References Cited

U.S. PATENT DOCUMENTS

| | | | |
|---|---|---|---|
| 6,219,049 B1 | 4/2001 | Zuffante et al. | |
| 7,688,318 B2 | 3/2010 | O'Malley, III et al. | |
| 9,972,127 B1 | 5/2018 | Gibson et al. | |
| 2012/0173208 A1* | 7/2012 | Houdouin | G06F 17/50 703/1 |

OTHER PUBLICATIONS

Planchard et al., "SolidWorks 2013 Tutorial with Video Instruction, A Step-by-Step Project Based Approach Utilizing 3D Solid Modeling", 80 pages.*
"Design Methods" retrieved from http://help.solidworks.com/2011/English/SolidWorks/sldworks/Legae . . . (2011).
"Top-Down Design Overview" retrieved from http://help.solidworks.com/2012/English/Solidworks/sldworks/top_ . . . (2012).

* cited by examiner

*Primary Examiner* — Thomas Lett
(74) *Attorney, Agent, or Firm* — Hamilton, Brook, Smith & Reynolds, P.C.

(57) ABSTRACT

In an embodiment, a computer-implemented method of creating a 3D-part within a computer aided design (CAD) three-dimensional (3D)-assembly can include, in the CAD 3D-assembly, creating the 3D-part based on user input received in the 3D assembly. The method can further include automatically associating a history with the created 3D-part, the history based on the user input used to create the 3D-part.

20 Claims, 18 Drawing Sheets

3D CONTENT CREATION TOOL WITH AUTOMATIC MATING

RELATED APPLICATION

This application claims the benefit of U.S. Provisional Application No. 61/920,133, filed on Dec. 23, 2013.

The entire teachings of the above application are incorporated herein by reference.

BACKGROUND OF THE INVENTION

In solid modeling, a "part" can consist of individual features. An example of a feature is a base of the part. The base is the feature on which a design engineer creates additional features. The base feature can be the result of an extrusion, a revolve, a sweep, a loft, a thickening of a surface, or a sheet metal flange, for example. Most commonly base features result from an extrusion operation in solid modeling.

An extrusion operation creates a feature by extruding a 3D object from a 2D sketch, essentially adding the third dimension. An extrusion that forms a base always adds material. An extrusion that forms a boss adds material, often on another extrusion. An extrusion that forms a cut removes material. A revolve, or revolution, operation creates a feature by revolving one or more sketch profiles about a centerline to add or remove material. The feature can be a solid, a thin feature, or a surface. A loft operation creates a feature by making transitions between profiles. A loft can form a base, boss, cut, or surface. A sweep operation creates a base, boss, cut, or surface by moving a profile (section) along a path. A boundary operation creates high quality, accurate features useful for creating complex shapes for the consumer product design market, the medical market, the aerospace market, and the mold market. A boundary can form a base, boss, cut, or surface.

Features can be either sketched features and/or applied features. Sketched features are based on sketch geometry. Sketched features can include extrusions, revolves, sweeps, and lofts. Applied features are features applied directly to the model. Applied features include chamfers, fillets, and shells.

Features are suited to be added to the model, whether the feature adds or removes material to or from the model. In many history-based modelers, for a given part, the model stores a history of features added, so that the design engineer can modify features after creation. Some solid modelers, however, do not store the history of features added. After the part is created, a design engineer can use a tool, (e.g., the SolidWorks Defeature tool) to remove feature-based details from a part or assembly and save the results to a new file in which the feature-based details are replaced by a "dumb solid." The "dumb solid" is a solid model without the feature definitions or history.

Motion studies are simulations of motion for assembly models, and can include graphical simulations or simulations of physical properties such as velocities and forces. A design engineer can incorporate visual properties such as object movement, lighting and/or camera perspective into a motion study. Motion studies do not change an assembly model or its properties, but rather simulate and animate motion that the design engineer prescribes for a model. The design engineer can employ SolidWorks mates to restrict motion of components in an assembly when modeling motion. The design engineer can use mates to restrict motion between components for motion studies. The design engineer can, for example, set the values for distance and angle mates, and change these values for different points in an animation. For example, the design engineer can add an angle mate to restrict the position of a first component to 30°. The design engineer can also use a motion study to animate the change in behavior of components when the value of the mate between two components incrementally changes from 15° to 45° over a period of time so the component moves accordingly.

SUMMARY OF THE INVENTION

In embodiments, the present invention solves three problems. First, prior versions of history-based modeling systems employ four different modes, a 2D sketch mode, 3D part modeling mode, assembly mode, and a simulation mode to create a part, assemble the part to other parts, and simulate motion. In addition, in creating parts and simulating motion for multiple parts, the design engineer is required to explicitly switch modes for each part created. Embodiments of the present invention allow a design engineer, in a single mode, to create a part and assemble it to other parts. The present invention automatically switches from the 2D sketch mode to the 3D part modeling mode (e.g., part creation mode) to the assembly mode, in a manner that hides this mode switching from the user.

Second, prior versions of modeling systems employ geometric definitions in feature or history-based part creation. These geometric definitions are of a different type in each mode. As a result, design engineers often have to create the same relationship definitions multiple times, once in each mode. For example, a design engineer attempting to create a model of a bearing centered on an existing shaft would first have to create a concentric relationship between the sketch of the bearing and the sketch, part geometry, or reference geometry features of the shaft in the part-creation environment. However, upon moving to the assembly environment, the design engineer still needs to create a concentric mating relationship to constrain the bearing to rotate and slide along the shaft. Further, attempting to include the history-based relationships simultaneously in both the part-creation environment and assembly environment generally results in "external references." An external reference is, for example, a reference from an assembly file to a part file, or a part file to another part file. However, a person of ordinary skill in the art has to maintain external references and are considered by some users as difficult to manage and control.

In an embodiment, the present invention provides automatic mate creation for parts in an assembly by inferring relationships of sketch entities (e.g. dimensions and/or 2D constraints) when the user creates sketch entities. Embodiments of the present invention creates the mates by transferring the sketch relationships based on (a) a selected plane, and/or (b) anchor points in a sketch. The system can also automatically infer multiple mates at one time a with the design engineer invoking the mate creation tool once.

Third, prior versions of modeling systems provide single purpose tools that enable the design engineer to put the application in a mode for creating a particular type of object. For example, the design engineer invokes a circle tool or a rectangle tool to create a circle or a rectangle, respectively. In addition, many modeling systems use the concept of pre-made or re-used content, analogous to clipart commonly found in Microsoft Office® products. Design applications can also enable a user to re-use design content using a design clipart function, as described in "Reusable data constructs for a modeling system" by O'Malley et al., U.S. Pat. No. 7,688,318, which is hereby incorporated by reference in its entirety. The design engineer can search for the appropriate content and then inserts that content into the existing workplace, for instance, by using a drag-and-drop operation. After inserting the content, the content can be modified using the application.

The above "clip-art" based approach enables the application developer to envision pre-designed objects for the design engineer to insert into the workplace. However, previous modeling system versions lack a workflow to insert a customized object based on pre-used or pre-made content. While a design engineer can insert a pre-used or pre-made content, the design engineer cannot efficiently modify the object seamlessly without switching modes of operation. Therefore, an embodiment of the present invention provides a mechanism for creating a new tool that optimizes workflows for creation of custom content. For example, the present invention provides a "Content Creation" feature, which allows the design engineer to make/design his own tools for future custom objects. Each customized tool can consist of a sketch shape and a creation method. For example, a tool for creating cylinders comprises a sketch shape of a circle and a creation method of 'extrude.' As another example, a tool for creating a torus comprises a sketch shape of a circle and a creation method of 'revolve' to create the torus. When a Content Creation based tool is applied, the respective type of part is automatically created. Relating to the above example of the sketch shape of a circle and creation method of 'revolve,' the design engineer, upon invoking the customized tool, would input the radius of the circle and the radius of the revolution of rotation to automatically create the model part.

Accordingly, embodiments of the present invention provide a computer-implemented method of creating a 3D-part within a computer aided design (CAD) three-dimensional assembly (3D-assembly). The method includes, in the CAD 3D-assembly, creating the 3D-part based on user input received in the 3D assembly by inferring the user input is aligned with at least one of a reference plane, object face, object feature, or grid point. The method automatically associates a history with the created 3D-part, the history being based on the user input used to create the 3D-part. In an embodiment, the method further includes automatically recording, based on the user input, the history by storing at least one user instruction used to create the 3D-part. The method enables a user to create a second 3D-part based on the recorded history.

In accordance with one embodiment of the present invention, the CAD 3D-assembly is agnostic to the history of the 3D-part.

In an embodiment, creating the 3D-part further includes selecting a part type, setting a location of the part, and setting a geometry of the part.

In an embodiment, creating the 3D part includes creating a plurality of 3D-parts. The method can also include automatically mating a first 3D-part with a second 3D-part by inferring a mating relationship between the first 3D-part and second 3D-part based on the user input.

In an embodiment, creating the 3D-part can include receiving user input to create the 3D-part in a 3D-assembly mode.

In accordance with another aspect, the method can include enabling a tool configured to create the 3D-part based on the history of the 3D-part. The tool can accept user input to create the 3D-part corresponding to the history of the 3D-part.

Other embodiments provide a computer-implemented method of mating a plurality of three-dimensional parts (3D-parts) in a computer aided design (CAD) 3D-assembly. Such a method of mating includes creating a first 3D-part and second 3D-part based on user input received in the CAD 3D-assembly. The method infers, based on the creation of the second 3D-part, a relationship between the first 3D-part and second 3D-part. The method can further include automatically mating the first 3D-part to the second 3D-part based on the inferred relationship of the first 3D-part and second 3D-part.

In other embodiments, a computer system for creating a 3D-part within a computer aided design (CAD) three-dimensional assembly (3D-assembly) is provided. The computer system includes a part creation module configured to create, in the CAD 3D-assembly, the 3D-part based on user input received in the 3D assembly. The computer system further includes a history module configured to automatically associate a history being with the created 3D-part, the history based on the user input used to create the 3D-part.

In an embodiment, a non-transitory computer-readable medium is configured to store instructions for creating a 3D-part within a computer aided design (CAD) three-dimensional assembly (3D-assembly). The instructions, when loaded and executed by a processor, can cause the processor to create, in the CAD 3D-assembly, the 3D-part based on user input received in the 3D assembly. The instructions can further automatically associate a history with the created 3D-part, the history being based on the user input used to create the 3D-part.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention is presented below.

As will be made clear by the description, embodiments of the present intention advantageously remove the need of the design engineer to explicitly switch between the part and assembly environments by allowing the design engineer to create one or more distinct parts using one command (in a single command or a single command invocation). Although hidden from the user, switching from the sketch environment to the part environment to the assembly environment is inherent to the command itself, which improves the efficiency of creating such parts and frees the user to concentrate on other tasks.

In another advantage of the present invention, embodiments automatically create one or more mating relationships simultaneously based on the user's prior creation of relationships, further increasing efficiency. For example, the design engineer can automatically create a mate when sizing a tombstone block between the face of another block and the edge of the tombstone.

In another advantage of the present invention, embodiments bridge the gap between the approach where each available object type is represented by a tool and the pre-used/pre-made content approach to modeling. The present invention provides an optimized workflow for the creation of the user's own content. This increases the efficiency of inserting pre-made content.

One alternative solution is to build a true Single Modeling Environment (SME) which closely intertwines regenerating the history-based features, and simultaneously solves mate systems for motion analysis (e.g., simply viewing or conducting a computational study). However, such a system does not provide advantages of having separate modes for 2D sketches, 3D part creation, assembly mode, and simulation mode. Another alternative is to use a content-based modeling approach. In this case, the design engineer simply inserts components as content. However, this limits the types and complexity of models that can be constructed and does not address geometric references between parts. Yet another alternative is the "Master Model" approach, where a user creates the geometry for all parts at one time and then separates the geometry into distinct parts later. While the Master Model approach can be an effective workflow for assemblies of small numbers of complex parts, the Master Model approach does not scale effectively for assemblies of large numbers of complex and/or simple parts.

In one embodiment of the present invention, the proposed functionality allows users to produce 3D concept assemblies rapidly. Such assemblies are characterized by simple geometry, optional imported geometry, and some amount of motion (including occasional motion analysis).

Figure 1A:
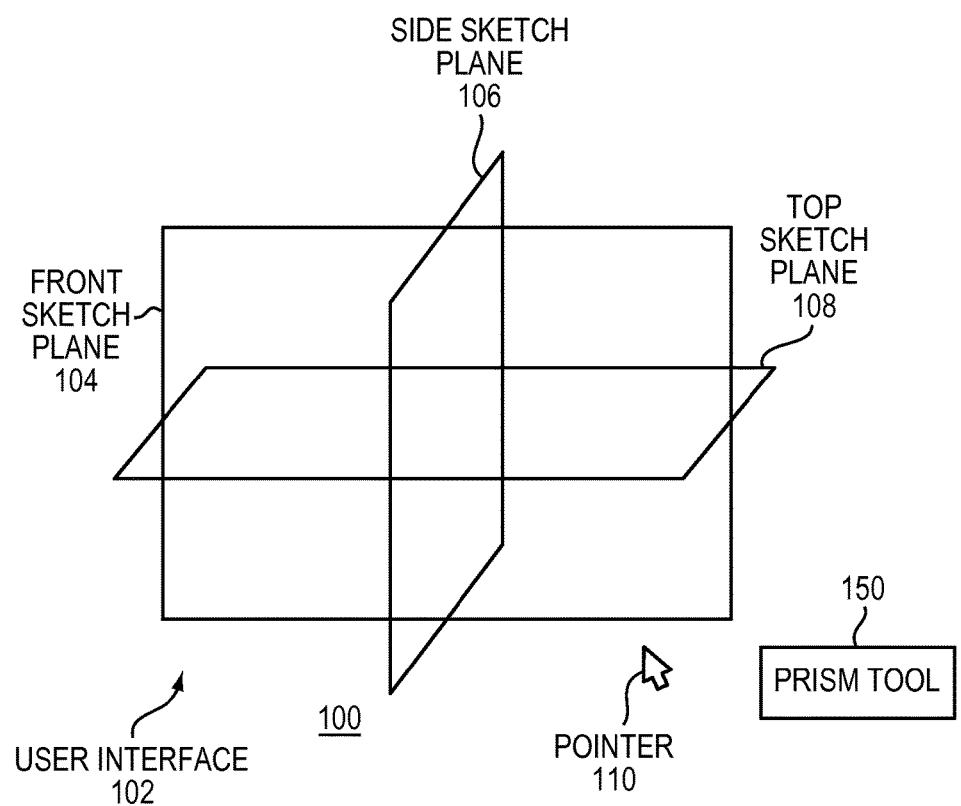
FIGS. 1A-C are diagrams illustrating an example embodiment of a user interface having a prism tool employed by the present invention.

FIG. 1A illustrates an example embodiment of solid modeling system 100 and a user interface 102 both of the present invention. The user interface 102 displays a front sketch plane 104, side sketch plane 106 and top sketch plane 108 to a user, who controls a pointer 110. In general, embodiments (e.g., system 100) of the present invention provide "primitive" commands that accept minimal input from the design engineer (user) to create a 3D part. First, the design engineer selects a sketch plane by hovering the pointer 110 over the desired plane (e.g., front sketch plane 104, side sketch plane 106, or top sketch plane 108). The user interface 102 can highlight the sketch plane over which the pointer 110 is hovering, so that upon selection, the design engineer can be certain which sketch plane he is selecting.

In an embodiment, the system 100 enables the design engineer to hover the pointer 110 over a face or a plane and begin sketching in that plane. In this way, system 100 frees the design engineer from having to explicitly click a reference plane to create each feature or sketch. The design engineer can hover the pointer 110 for a short time over a face or a plane and receive feedback from the system 100 that the plane is in fact activated to draw a sketch. In an embodiment, the system 100 can improve ease of use by making certain assumptions based on the default three planes 104, 106, 108 and the view orientation. System 100 makes assumptions based on the fact that most parts in a conceptual model are sketched on planes parallel to the default three planes (e.g., front 104, top 108, and right or side 106). For example, if the design engineer hovers the pointer 110 over white space representing "air" (e.g., an area with no sketch or object) in the screen view, then the system 110 can assume that the design engineer is intending to select a plane coincident to a front, top, or right assembly plane, whichever is most parallel to the display screen. As another example, if the user hovers the pointer 110 over a cylindrical face, the system 100 assumes a plane through the center of the cylinder and parallel to the default plane closest to being parallel to the display screen. The system 100, based on these assumptions, creates new reference planes parallel to the default three planes (e.g., front 104, top 108, right 106) for creating additional objects or sketches.

Figure 1B:
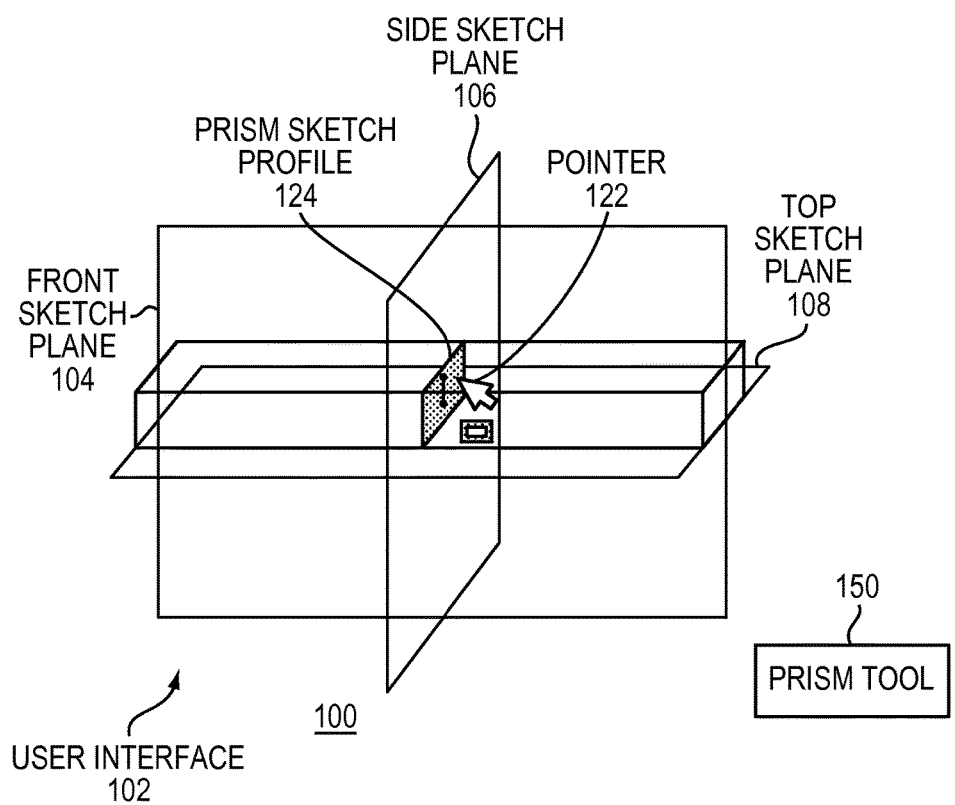

FIG. 1B illustrates the example embodiment of the user interface 102 where the design engineer has selected side sketch plane 106. The design engineer, after incrementally selecting the side sketch plane 106, can draw any number or kind of primitive sketches enabled by respective step saving tools 150, 250, 350, 450 (detailed further below) for example.

The different types of primitives provided by embodiments may include a solid cylinder, a hollow cylinder, a link, a tombstone/tab, a prism, a box-section, or a primitive hole. The above example in FIGS. 1A-1B describes the creation of a prism sketch entity (primitive sketch) in an embodiment of system 100. The below description describes embodiments of creating the other listed example primitives.

A solid cylinder primitive is used to model rods, shafts, pivots, bolts, etc. The workflow to create a solid cylinder includes the design engineer inferencing a desired sketch plane similar to that detailed in FIG. 1A above. The design engineer then sets the center of the circle with a first click. The design engineer then sets the edge of the circle radius with a second click (the line segment formed between the point defined by the first click and the point defined by the second click being the radius). The design engineer then sets the depth (also referred to as height) of the cylinder with a third click. The parameters of the solid cylinder primitive are diameter (twice the radius) and length (height). The solid cylinder primitive provides the resulting sketch or solid modeling feature of a midplane extrusion of circle, for example. The origin of the new part constructed on this feature is on the cylinder axis in the middle of the cylinder's length (i.e., midplane). No additional reference geometry is created.

A hollow cylinder primitive is used to model tubes, rings, bearings, gears, pipes, etc. The workflow to create a hollow cylinder includes inferencing a desired plane (as illustrated in FIG. 1A). The design engineer sets the center of a circle with a first click. The design engineer then sets the edge of the outer circle radius with a second click (the line segment formed between the point defined by the first click and the point defined by the second click being the radius). Then, either the design engineer sets the edge of the inner circle radius with a third click, or, the system 100 sets the inner circle radius without input from the design engineer using a default inner circle radius. For example, embodiments use as a default inner circle radius a percentage of the outer circle radius, a fixed value, etc. The design engineer then sets the depth (height) of the cylinder with a fourth click. The parameters of the hollow cylinder primitive are inner diameter, outer diameter and length. The hollow cylinder primitive provides the resulting sketch or model feature of a midplane extrusion of two concentric circles, for example. Two circles are used instead of a thin feature because the design engineer controls the inner diameter and outer diameter instead of the wall thickness. The geometrical origin of a point comprising of this feature is on the cylinder axis in the middle of the cylinder's length (i.e., midplane). No additional reference geometry is created.

A link primitive is used to model links. The workflow of creating a link includes the design engineer inferencing the desired sketch plane (as in FIG. 1A). Next, the design engineer sets the center of a first end of the link with a first click. Then, the design engineer sets the center of a second end of the link with a second click. The design engineer sets the width of the slot of the link with a third click. The design engineer then sets the depth of the slot (along a longitudinal access of the link) with a fourth click. The parameters to create an instance of a link from the link primitive are the lengths between outer hole centers, width, and diameter (inner and outer) of holes. The link primitive provides the resulting sketch or model feature of a midplane extrusion of the slot with three equal-diameter circles added at the ends and in the center. The diameter of the circles defaults to half the width of the slot, however the design engineer can adjust the diameter of the circles. The geometrical origin of a part comprised of the link feature is located at the center of the slot hole, with the XY axis coincident with the middle hole's axis. The additional reference geometry created is the axes of the end holes of the link.

A tombstone (or tab) primitive is used to model pivot points, pillow blocks, etc. The workflow to create a tombstone includes the design engineer inferencing a desired sketch plane (as in FIG. 1A). Next, the design engineer sets the center of a circle with a first click. The design engineer then sets the bottom center of the tab with a second click, establishing an orientation of the tab. The design engineer then sets the width of the tab with a third click. The design engineer sets the depth (e.g., with an extrude depth operation) of the tab with a fourth click. The tombstone primitive provides a resulting sketch or model feature of a midplane extrusion of a tombstone with circle. The circle diameter defaults to half the width of a slot, and while the circle diameter is adjustable by the design engineer, it cannot exceed double the tombstone height. The parameters of the tombstone primitive are height (e.g., measured from the hole center to bottom edge), width, and diameter of the hole. The geometric origin of a part comprising the tombstone features is located at the center of the hole, with the XY axis aligned to intersect the hole axis.

A prism primitive is used to model boxes, plates, bars, etc. As illustrated in FIG. 1A above, the workflow for creating a prism primitive is the design engineer inferencing the desired sketch plane (FIG. 1A). Next, the design engineer sets the first corner of the rectangle with a first click. The design engineer sets the second corner of the rectangle with a second click. The design engineer sets the depth of the prism (e.g., the extrude depth) with a third click. The prism primitive provides a midplane extrusion of the center rectangle. The prism primitive has parameters of height, width, and depth. The geometric origin of a part comprising a prism feature is located at a geometric center of the prism, with reference planes parallel to faces of the prism.

A Box-Section primitive is used to model element members, rails, rooms, enclosure sides, cabinets, etc. The workflow to create a Box-Section includes the design engineer inferencing the desired sketch plane (FIG. 1A). The design engineer sets a first corner of the rectangle with a first click. The design engineer sets a second corner of the rectangle with a second click. The design engineer sets depth of the rectangular prism with a third click. The Box-Section primitive creates a midplane thin extrusion (offset inward) of a center rectangle. The Box-Section has parameters of height, width, depth, and wall thickness. The geometric origin of a part comprising a box-section feature is located at a geometric center of prism, with reference planes parallel with faces of the prism.

Figure 8A:
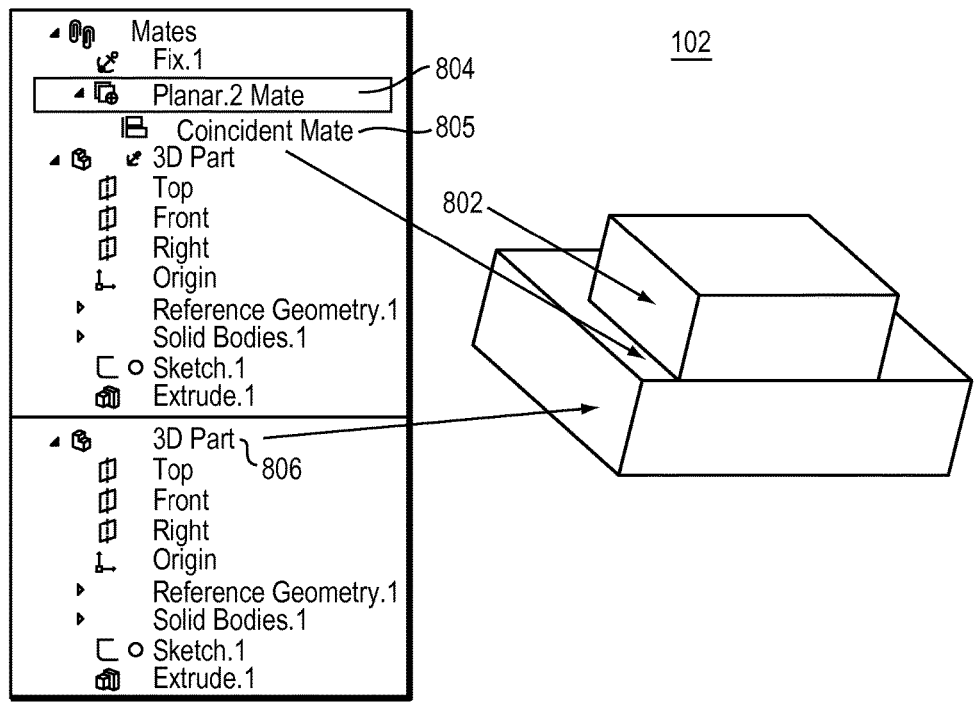
FIGS. 8A-F are diagrams illustrating an example embodiment of a user interface having a hole primitive tool with automatic mating employed by the present invention.
Figure 8B:
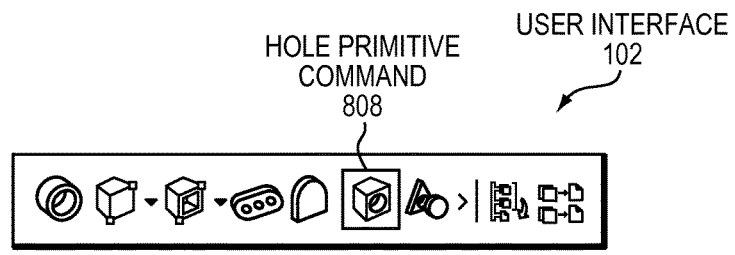
Figure 8C:
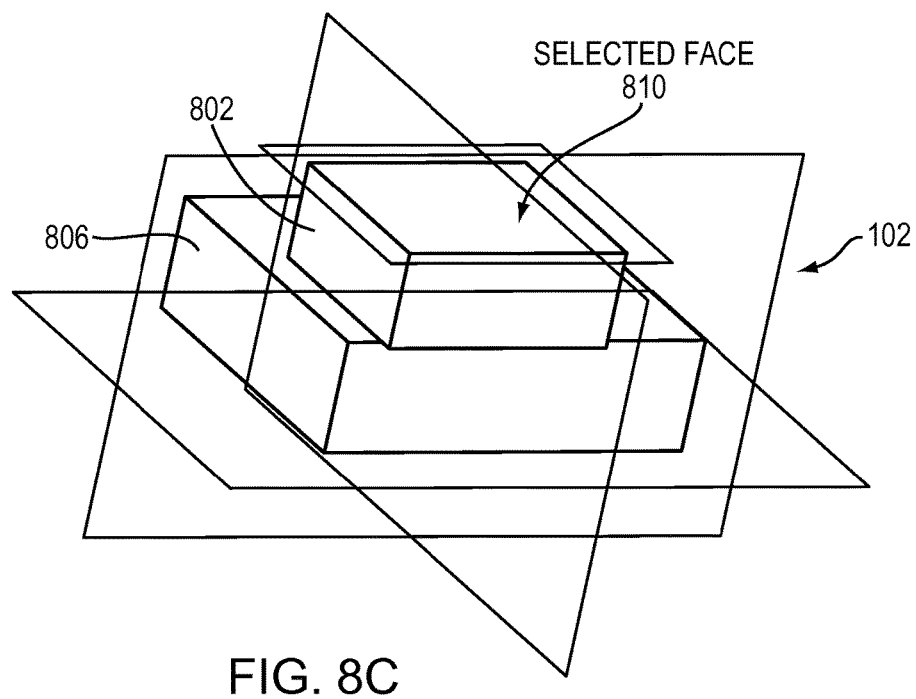
Figure 8D:
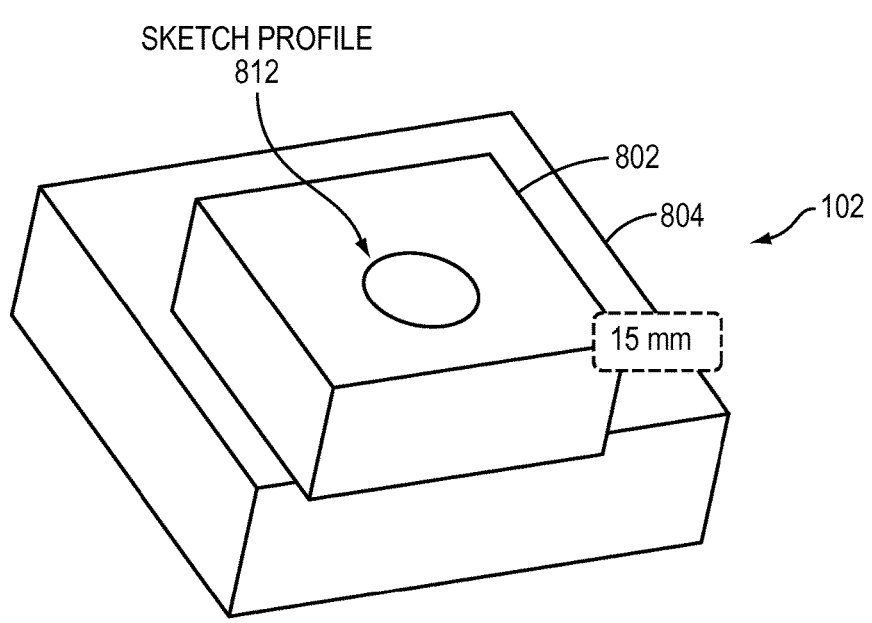
Figure 8E:
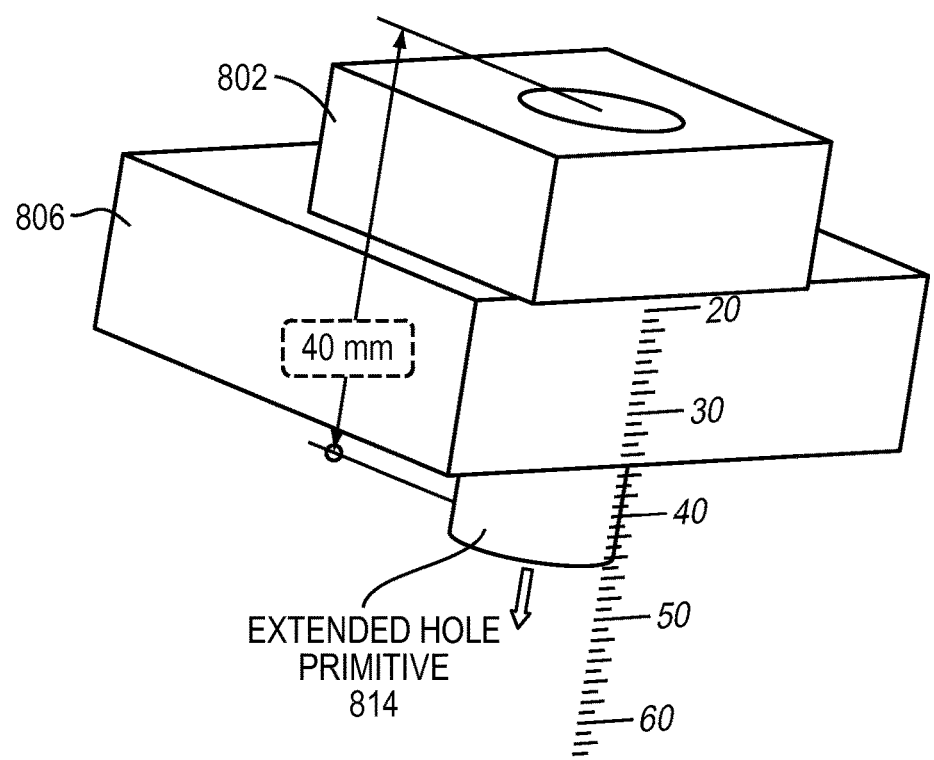
Figure 8F:
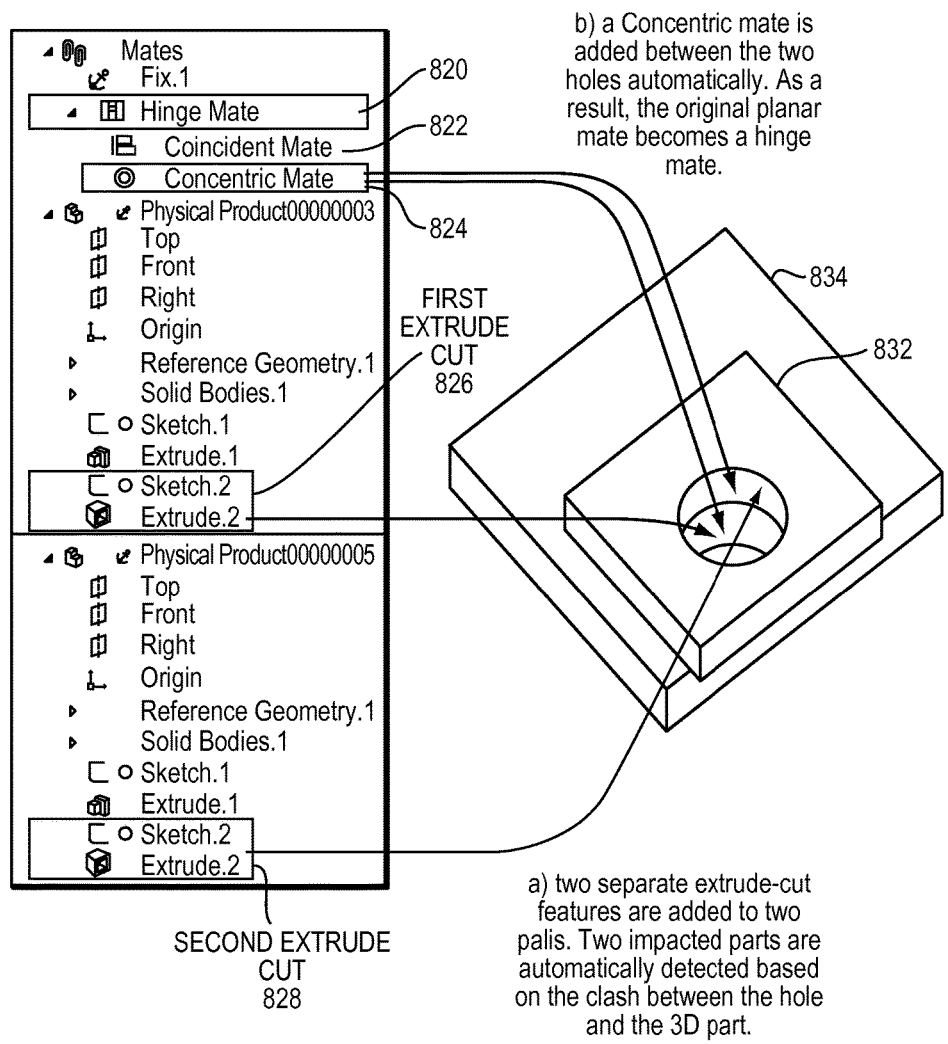

FIGS. 8A-F show an example of a hole primitive being used to cut material from inferenced 3D parts. For example, a hole primitive can add an extrude-cut feature in each inferenced 3D part. The hole primitive can also automatically creates concentric mates between these holes. For example, consider 3D parts 802 and 806 of FIG. 8A. 3D parts 802 and 806 are mated with a face to face planar mate 804, which is a coincident mate 805. In reference to FIG. 8B, the design engineer can create a hole primitive by first selecting the hole primitive command 808. In reference to FIG. 8C, the design engineer then selects a selected face 810 of one of the 3D parts 802 or 806 (or a reference plane) for placing the sketch of the circle for the holes. In reference to FIG. 8D, the design engineer sketches a sketch profile 812 of a circle along the selected face 810. In reference to FIG. 8E, the design engineer then moves his or her pointer to specify a depth of the hole primitive, and clicks the mouse to indicate completion of the hole primitive. In FIG. 8E, the design engineer has drawn a depth of the extruded hole primitive through the 3D parts 802 and 806. In FIG. 8F, after completing creating the hole primitive, the system subtracts material (e.g., a first extrude cut 826 and second extrude cut 828) from each 3D part (e.g., 3D parts 802 and 806 of FIGS. 8A-E) intersecting the extruded hole primitive. The system therefore creates 3D parts 832 and 834 having holes cut out by the first extrude cut 826 and second extrude cut 828. When the hole primitive spans multiple 3D parts and therefore cuts material from each of those 3D parts, as in FIGS. 8A-F, the system automatically mates the holes created in the 3D parts with a concentric mate 824. The system therefore converts the planar mate 804 to a hinge mate 820. A coincident mate 824 between the first extrude cut 826 and second extrude cut 828 is added. The 3D parts 832 and 834 continue to have a coincident mate 822.

Returning to the example of FIG. 1B, the design engineer elects to draw a prism primitive within the side sketch plane 106. The design engineer draws prisms sketch profile 124 for instance, by selecting the location of two corners of the prism primitive/sketch profile 1 through 4 in the side sketch plane 106 with a pointer 122. Although the operation for creating a sketch prism primitive can receive input of point locations of two corners, system 100 also allows the design engineer to input an indication of the center of the prism and either, point location of one corner of the prism, a width and height of the prism, or a three point prism profile that allows the design engineer to input three corners of the prism. Thus system 100 operates in two-corner mode or from-center mode for generating prism sketches. In one embodiment, to shift between the two corner mode and the from center mode, the system 100 can employ a user selectable modifier key. The modifier key toggles between the two modes or otherwise user selectively provides the from-center functionality.

Figure 1C:
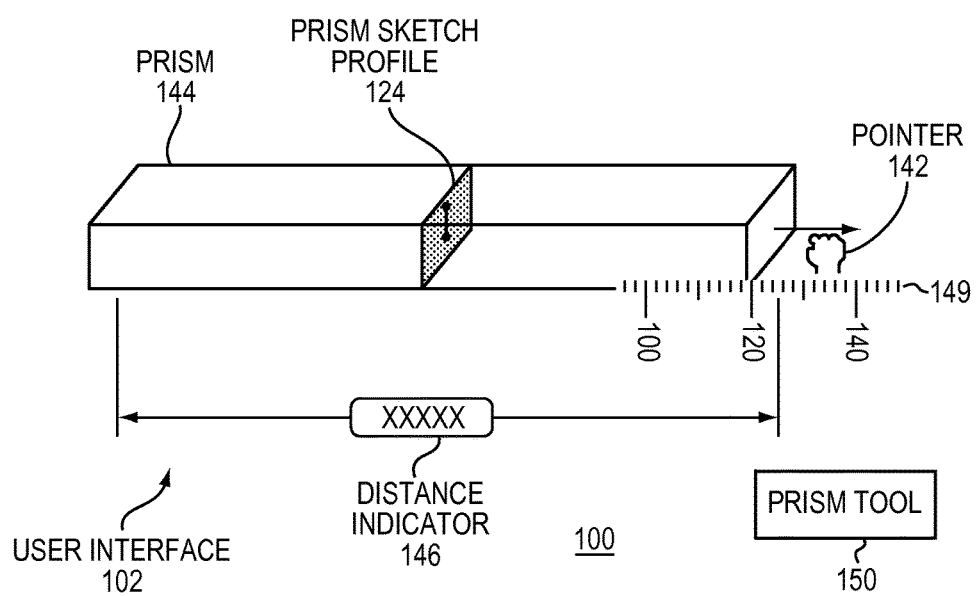

FIG. 1C illustrates the user interface 102 where the design engineer has extruded (e.g., a midplane extrusion) a feature from the prism sketch profile 124. In an embodiment, upon completion of user input to create the prism sketch profile 124, the prism creation tool 150 automatically accepts input to extrude the prism sketch profile 124 without any further command from the user. Thus the design engineer extrudes the prism sketch profile 124 by completing input to create the prisms sketch profile (prism primitive) 124.

In contrast systems of the prior art require the user to issue a first command to create the prism sketch, and after creating the prism sketch issue a second command separate and distinct from the first command to extrude the prism sketch. The first command does not accept any user input for specifying the extrusion unlike Applicant's step saving invention illustrated by tool 15 prism tool 150.

In other embodiments the prism creation tool 150 can switch to operations other than extrusion for generating base features.

The present creation tool 150 accepts input for extrusion based on the location of a pointer 142. The prism tool 150 extrudes the prism sketch profile 124 by creating the prism 144 having a total length equal to twice the distance from the pointer 142 to the prism sketch profile 124. Prism tool 150 draws equal halves of the prism 144 on each side of the prism sketch profile 124. This is a 'mid-plane extrusions' because the prism sketch profile 124 is the plane in the middle of the length of prism 144. However other embodiments can extrude the prism 144 in other ways, for example, by the prism sketch profile 124 being an end face of the prism 144.

In prior systems, the design engineer cannot interact with the third dimension by pointer dragging motion when the third dimension is normal to the sketch plane. In these cases, the depth selection from the design engineer is not needed and the system 100 of the present invention automatically creates the feature with a default depth. In an embodiment, a default depth is calculated by taking 20% of the size of the first 2D profile's bounding box and rounding to a reasonable number of significant digits (e.g., for SI units) or fractions/inches (e.g., for imperial units), but other methods of calculating a default depth (e.g., other percentages of the size of the 2D profile, a fixed value, etc.) are available. The system 100/prism tool 150 should control the default extrude direction to avoid interference.

The system 100 displays to the design engineer exact values for the primary dimensions during primitive creation, even while the user is adjusting the size of the sketch or object. The design engineer can also manually enter the extrusion distance into a distance indicator 146 for a precise extrusion length. Upon the design engineer finalizing the size of the prism 144, the system 100 automatically "componentizes" the feature (e.g., the extrusion) into a new part, the new part having a defined origin, location and orientation.

In an embodiment, the design engineer has immediate access to all of the critical dimensions for each primitive for editing via user input (e.g., keyboard entry, dragging a pointer 142). "Immediate access" means the user should be able to access or edit any of the critical dimensions without switching assembly context or using breadcrumbs (e.g., an entity referring to the parent-child relationship of an object). In one embodiment, the user accesses or edits the dimensions by either a single- or double-click with a mouse (cursor control or input device).

Using point and drag user interface techniques, the design engineer arranges items such as lines, dimensions and other annotations in a screen view of a drawing (e.g., sketch). The system 100 can provide an enhanced ruler 149 configured to automatically center or align pointer dragged items in the drawing. To accomplish this, the enhanced ruler 149, by default, snaps pointer dragged items to a predetermined position (e.g. centering alignment, edge alignment, etc.) to within a user adjustable granularity. To adjust granularity, the design engineer may move the pointer 142 of the user interface 102 over the finer gradations of the ruler 149. In a step saving manner, during a dragging motion by the user in the user interface, the system 100 enables the snapping feature, however users can enter values between snapping intervals if necessary.

The tools for creating primitives in embodiments of the present invention enable the design engineer to create any number of the same primitive with one indication of the respective primitive tool command. For example the design engineer can invoke the prism tool creation tool 150 once (one time instead of four times) to add four legs of a table, or invoke the link tool 350 (described below in FIGS. 3a-3d) once to create multiple links of a four-bar linkage.

Figure 2A:
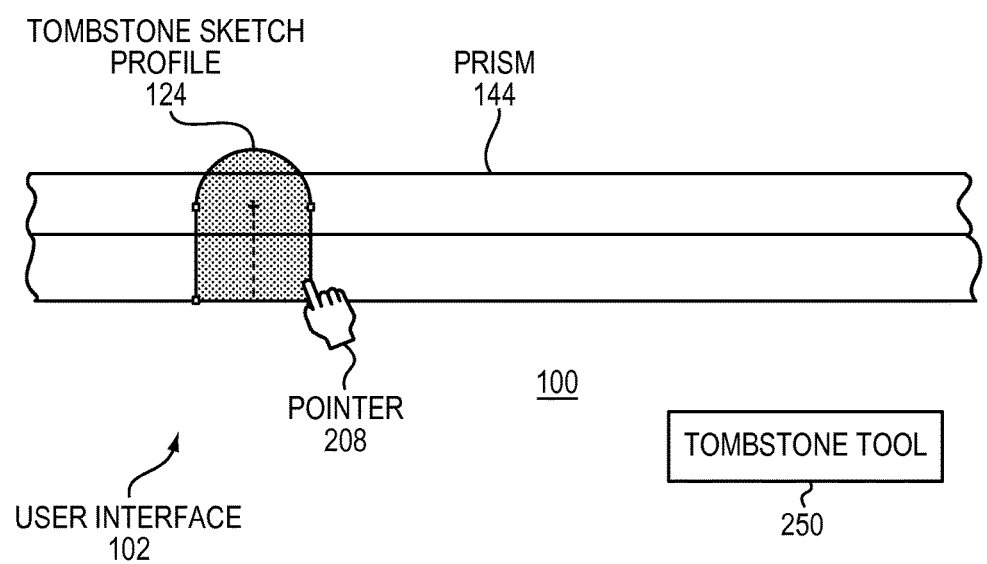
FIGS. 2A-B are diagrams illustrating an example embodiment of a user interface having a tombstone tool employed by the present invention.

Continuing from the example of FIGS. 1A-C, reference is now made to FIG. 2A. The design engineer selects a tombstone tool 250 to build a tombstone part. In response, the user interface 102 displays tombstone tool pointer 208.

The design engineer using pointer 208, draws a tombstone primitive or sketch profile 206 in the user interface 102. In particular, similar to FIG. 1b where the design engineer inferentially selects a sketch plane for the prism sketch profile 124, in FIG. 2a the design engineer hovers the pointer 208 on a face of the prism 144 to inferentially select that face as a sketch plane for the tombstone primitive. Modeling system 100 responds by illustrating pointer 208 on the inferentially selected sketch plane. The design engineer, after inferentially selecting the prism 144 face as the sketch plane draws the tombstone sketch profile 206 within this selected sketch plane, for instance by selecting the location of two corners of the tombstone sketch profile 206 with pointer 208. Based on the two corners, system 100 (tombstone tool 250) automatically determines the arc of the half circle of the tombstone primitive at the top of the tombstone sketch profile 206. The system 100/tombstone tool 250 can also automatically create a hole in the tombstone sketch profile 206 based on a radius. The system 100 determines length of the radius to be either: (i) proportional to the size of the tombstone sketch phase 206 or, (ii) equivalent to an amount that extends a fixed distance from the edge of the tombstone sketch phase 206, or (iii) a user input amount. For the later, system 100 automatically switches to a user input mode prompting the user to input the radius of the hole of the tombstone sketch profile 206.

Figure 2B:
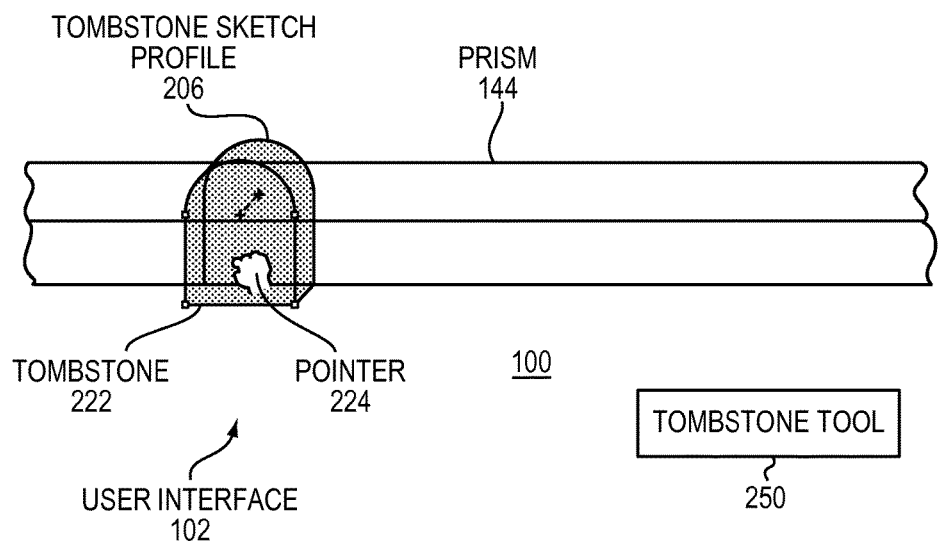

Continuing with FIG. 2b, after the design engineer has entered tombstone sketch profile 206 with a corresponding hole in user interface 102, the system 100/tombstone tool 250 automatically switches to an extrusion mode to allow the design engineer to add an extrusion feature to create a tombstone part 222.

In extrusion mode, the design engineer uses a pointer 224 to adjust the depth of the extrusion of the tombstone 222. The system 100 (tombstone tool 250) further recognizes that the tombstone sketch profile 206 is against a front face of the prism 144. Based on this recognition, the system 100/tool 250 does not perform a mid-plane extrusion, which would extend the tombstone part 222 into the prism 144, but rather extrudes the tombstone 222 away from the prism 144 to prevent overlap as a default. However, the design engineer could change the extrusion mode as desired or needed.

As previously described, during creation of a part, the system 100/tombstone tool 250 provides sketch and feature snapping (e.g., snapping up-to-entity for extrude). For example, when drawing a sketch, the system 100 can snap the sketch entity to edges of other sketch entities or reference geometry, such as grid entries. In addition, feature snapping allows the system 100 to snap the part to other parts, for example, by snapping a face of an object being extruded to a face of an existing object. Snapping does not create references between the two objects, such that snapping can be supported regardless of the history of the object. Snapping is a way of providing the user a guide to set the dimensions of a sketch or part, but does not define the sketch or part by referencing the objects or entities to which the part or sketch is being snapped.

Further, during creation of the part, the system 100/tombstone tool 250 can record the history of the steps that the user took to create the part. For example, for a custom part other than the basic primitives described above, the system 100 can record the history of creating the part for simplified re-creation later. For example, suppose the user creates a rectangular prism with four cylindrical holes. The system 100 can record the creation of the rectangular prism and the properties of the cylindrical holes, and create a custom tool that creates the rectangular prism and allows the user to easily customize the size and/or location of the holes, or set the size and/or location of the holes to a default location.

Figure 3A:
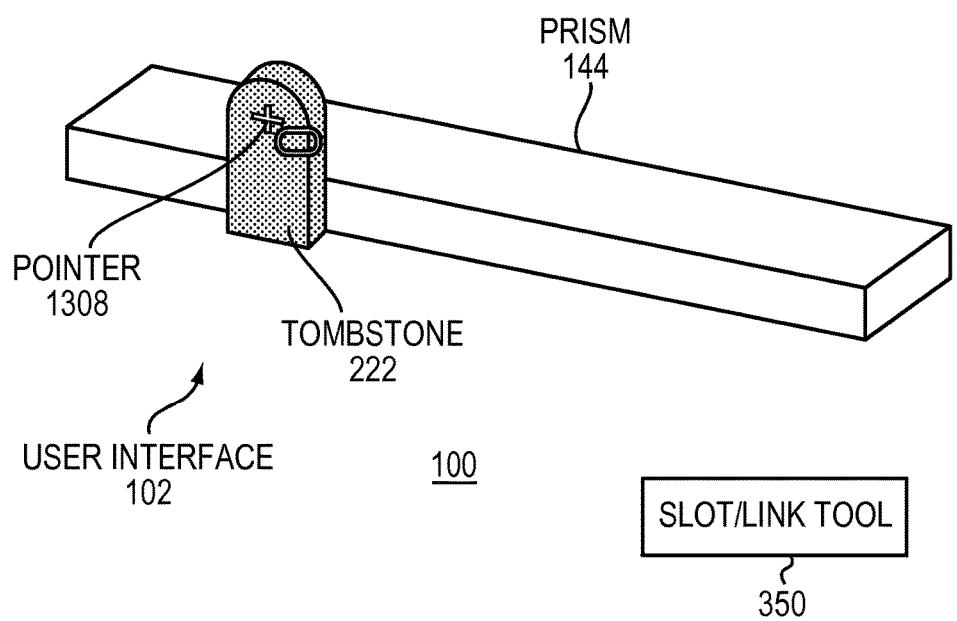
FIGS. 3A-D are diagrams illustrating an example embodiment of a user interface having a slot/link tool employed by the present invention

FIG. 3A illustrates user interface 102 operating an example embodiment of slot/link tool 350. The user interface 102 in FIG. 3*a* continues after the design engineer has created the prism part 144 of FIGS. 1*a*-1*c* and tombstone part 222 of FIGS. 2A-B.

The design engineer begins creating a slot/link by moving a pointer 1308 over the hole of the tombstone 222 in the user interface 102. Upon selecting the hole of the tombstone 222, the system 100/slot/link tool 350 automatically determines a sketch plane (by inference) and further makes inferences that a starting input of the slot/link primitive should be the center of the hole of the tombstone 222. The system can make an inference by determining, based on the user input, a relationship of the sketch or part being created and existing reference geometry or an existing part or sketch. The starting input of the slot/link primitive is the center of one of the ends of the slot/link primitive, where a radius extends to make a curved ending.

Figure 3B:
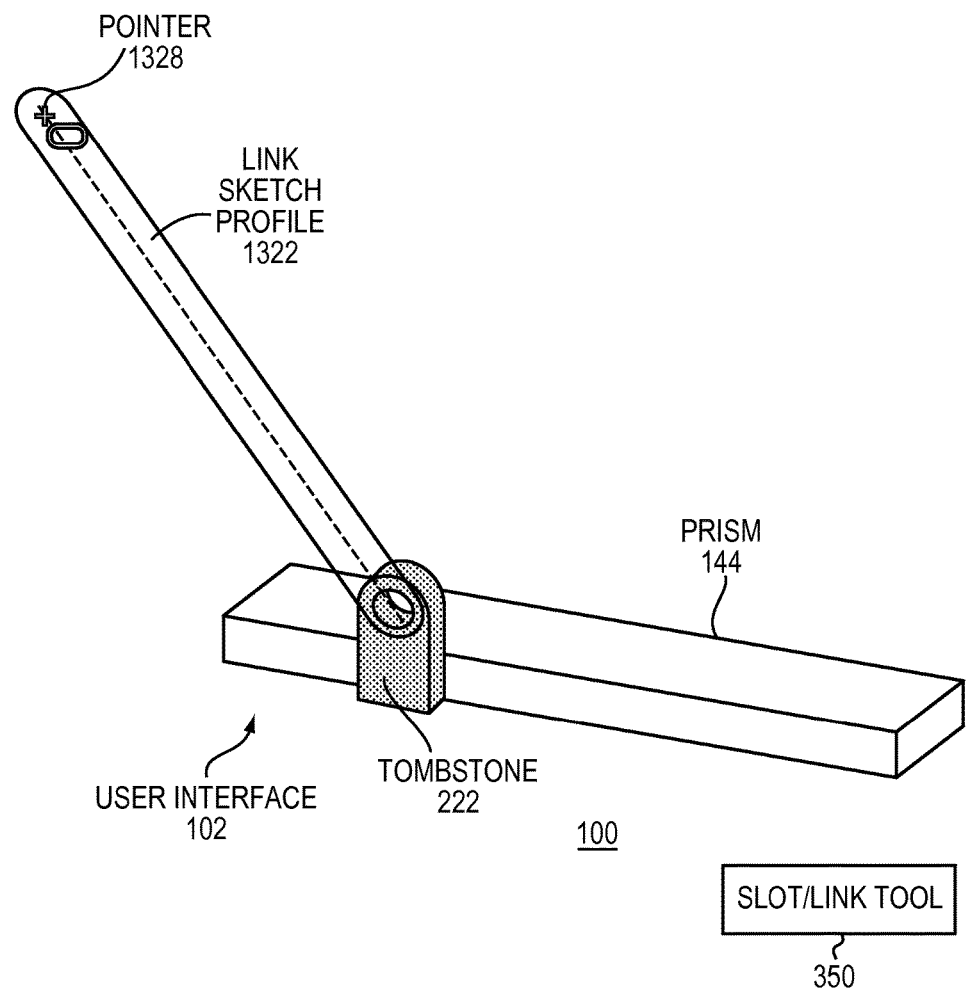

Upon creation of the slot/link primitive, the system 100/slot link tool 350 automatically creates a new origin/coordinate system for the creative primitive. The created origin is placed in a useful location, which is not necessarily on the plane selected during creation, to ease creation of mating relationships and inferences. After creating (initializing) the new coordinate system, system 100 displays an associated pointer 1328 in user interface 102 as illustrated in FIG. 3*b*.

Display of the pointer 1328 as changed from the initial pointer 1308 in FIG. 3A, prompts the design engineer to define a length of a link sketch profile (the created primitive) 1322 using pointer 1328. Upon moving pointer 1328 to select the position of the second ends of the link sketch profile 1322, the design engineer can add a feature to the link sketch profile 1322. As in FIG. 2B, with the holes in the tombstone 222, the system 100 can automatically add holes to the link sketch profile 1322 as well.

Figure 3C:
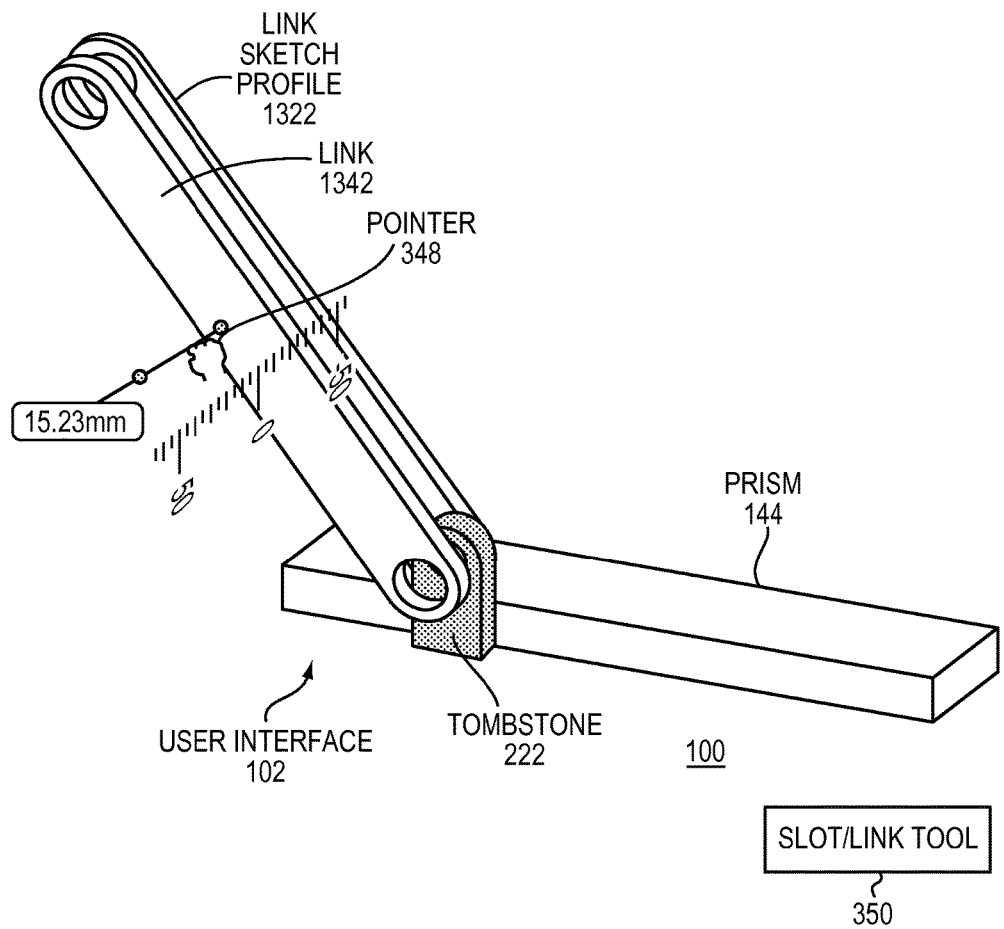

The default drag behavior for drawing the depth of the link 1342 in FIG. 3C is "blind" (into and out of the plane of the screen display). However the resulting extrusion is "midplane," which means that the drawn link 1342 should be translated so that it appears in the correct position. The default planes do not lie in the plane/face that the user inferentially selected to start the slots/link primitive in FIG. 3*a*.

Continuing in FIG. 3C, the design engineer can extrude the link sketch profile 1322 of the primitive to become a link (model part) 1342 by adjusting a pointers 348 along a corresponding ruler displayed in user interface 102 to give the link primitive depth.

Figure 3D:
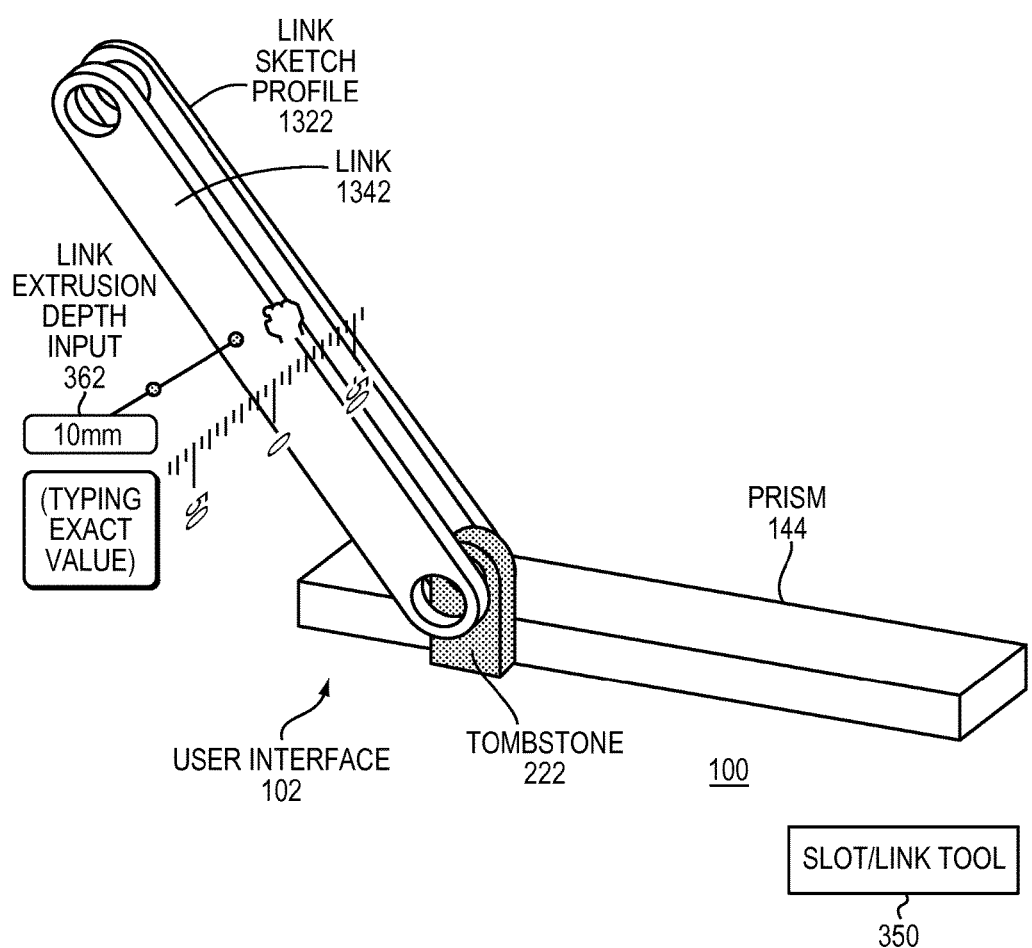

As illustrated in FIG. 3D, the design engineer can, instead of extruding using pointer 1348, instead enter in a depth amount into a link extrusion depth input field 362. The input field option allows the design engineer to set a more precise extrusion depth if the design engineer desires.

Figure 4A:
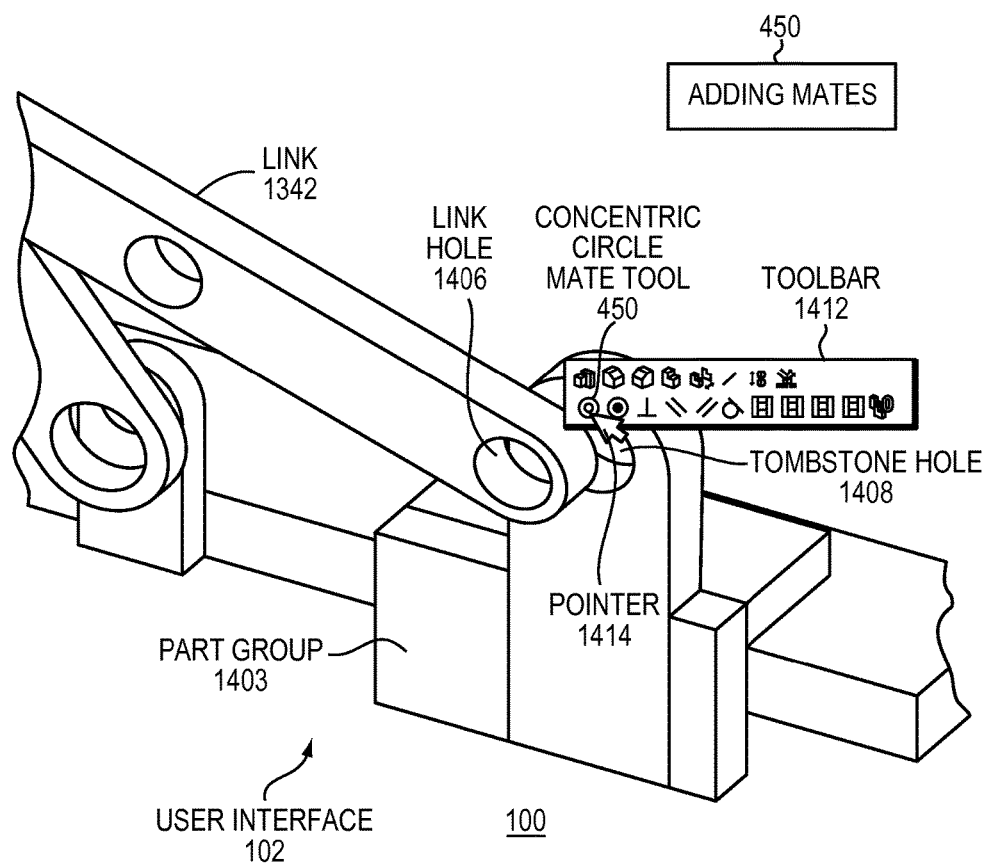
FIG. 4A-B are diagrams illustrating operation of the example of mating of parts according to the principles of the present invention.

FIG. 4A illustrates the example embodiment of user interface 102 displaying a link 1342 and a part group 1403, which includes a tombstone. The part group 1403 is a plurality of parts created by the design engineer that are grouped together such that movement, or any other action, to one of the parts applies to the entire part group 1403. The part group 1403 includes a tombstone hole 1408, and the link 1342 includes an associated link hole 1406. The system 100 can further employ color to visually indicate to the design engineer groupings of parts or sketches. For example, parts that are fixed components can be shown in a particular color and parts manually put into a particular group can be shown in another particular color.

The design engineer may wish to create a mating relationship between the link hole 1406 and tombstone hole 1408. The design engineer can select a concentric circle mate tool 450 from a toolbar 1412 to begin creating the mating relationship. Then, the design engineer, using a pointer 1414, can select the link hole 1406 and tombstone hole 1408. The system 100 responsively aligns the center of the link hole 1406 to the center of the tombstone hole 1408 and creates the mating relationship automatically (i.e. without requiring the user to explicitly indicate or otherwise recite the mating relationship).

In another embodiment, the system can automatically create the mating relationship between the link hole 1406 and tombstone hole 1408. For instance, upon creation of the link hole 1406 and tombstone hole 1408, the system can automatically infer that the user intended for the link hole 1406 and tombstone hole 1408 to be mated. The system can then automatically create a mate between the link hole 1406 and tombstone hole 1408 without requiring any additional input from the user. The user, if he or she desires, can remove the mate later if the inference of creating the mate is incorrect.

Figure 4B:
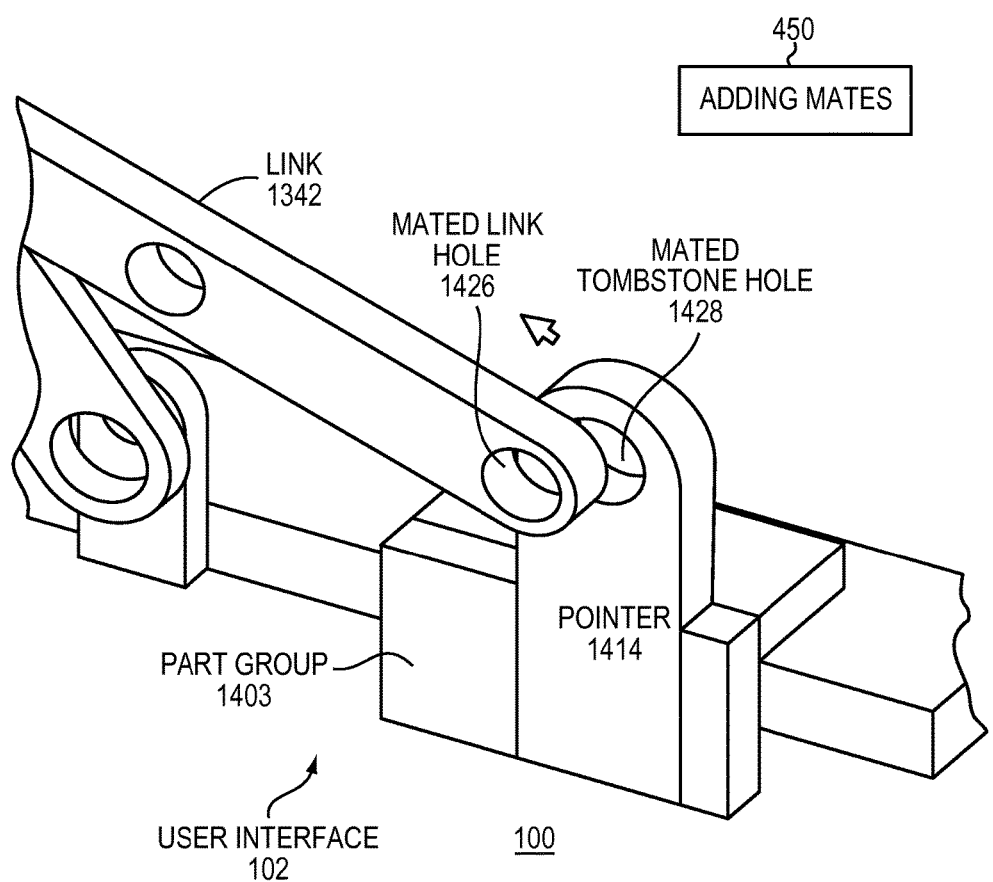

The user interface 102 in FIG. 4B shows the link 1342 and part group 1403 of FIG. 4A, however, with a mated link hole 1426 and mated tombstone hole 1428. The mated link hole 1426 and mated tombstone hole 1428, after invoking the concentric circle mating tool 450, are now aligned concentrically and also mated, so that movement in a motion study of the mated link hole 1426 causes movement of the mated tombstone hole 1428. The mated state of linked hole 1406 is referenced 1426, and the mated state of tombstone hole 1408 is referenced 1428 for purposes of illustration.

In an embodiment, the present invention can convert inferences into assembly mates once the parts are componentized. First, the system 100 fixes a first component in a product. Then, the system 100 converts inferences to centers of holes to concentric mates. Similarly, the system 100 converts inferences to vertices and edges to coincident mates. Then, the system 100 converts to a corresponding coincident mate the snaps during the design engineer's steps taken to create a feature, such as during the design engineer adding an extrusion by dragging.

In an embodiment, a "soft mate" is a mate added based on coincident geometry at the time of part creation. The design engineer can employ a "drag without mates" tool to pull soft mated parts away from each other, which automatically removes the corresponding soft mate relationships between the soft mated parts. Any planar faces that are coincident at the time of creation of one of the coincident objects are given "soft" coincident mates (by system 100) in addition to any other mates created due to inferencing. Any cylindrical faces which are concentric at the time of creation are also given "soft" concentric mates.

Single-Part "Hinge" and "Slider" mates allow a part to be constrained to slide or rotate, for instance around an axis, without a fixed part to be mated. These mates are analogous to fixing a point in a 2D sketch.

To support the quick development of mechanisms, the system 100 solves the assembly mates in real-time as the design engineer edits the parts in the 3D assembly. The system 100 does not prevent the user from dragging a part to a size/shape that the mate cannot solve. Instead, the system 100 attempts to solve the mates to provide a realistic, sketch-like experience.

In the foregoing ways of illustration of FIGS. 1A-B, embodiments of the present invention provide step saving model tools and operations.

Figure 5:
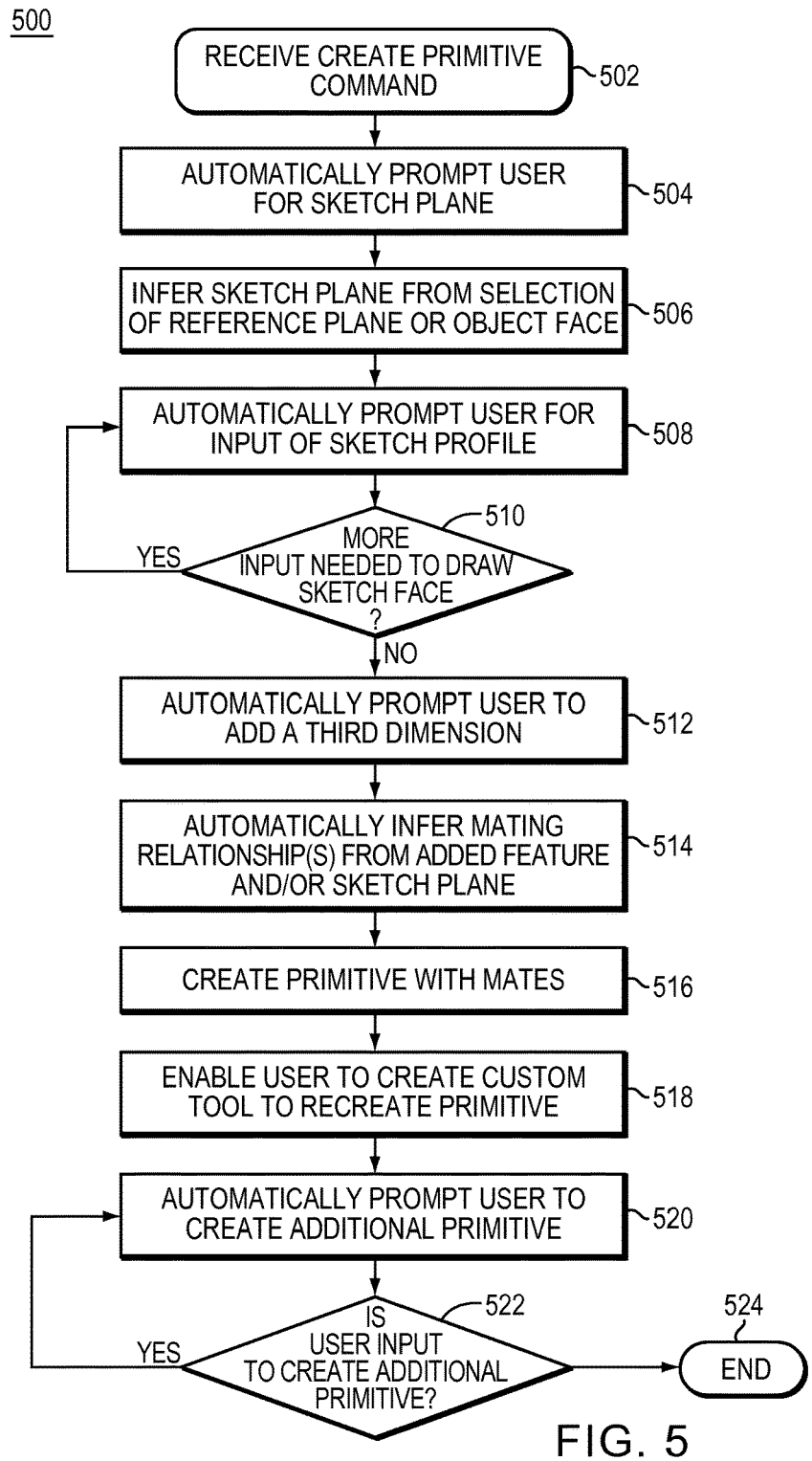
FIG. 5 is a flow diagram illustrating an example embodiment of the present invention.

FIG. 5 is a flow diagram 500 illustrating an example embodiment of the present invention. The system 100 first receives a create primitive command from a user (502). The user can input the create primitive command by selecting an icon on a toolbar, for instance. The system 100 then automatically prompts the user for a sketch plane (504), as described in the systems and methods above. The system then infers a sketch plane from the user's selection of a reference plane or object face (506) as described by the systems and methods above. Having selected a sketch plane, the system 100 then automatically prompts the user for input of a sketch profile on the sketch plane (508). The system then determines whether more input is needed to draw the sketch profile (510) and if so, automatically prompts the user for input of the sketch profile (508). The system automatically prompts the user for input of the sketch profile (508) in accordance with the above description of FIGS. 1A-4B, describing the creation of primitives such as a prism primitive, tombstone primitive and a slot/link primitive.

If no more input is needed to draw the sketch profile (510), the system 100 automatically prompts the user to add a third dimension, for instance, by dragging out to create an extrusion (512). The system 100 automatically infers mating relationship(s) from the added feature and/or sketch plane (514). For example, if the user adds an extrusion feature to the primitive that snaps to a face of an existing object, the system 100 can infer a mating relationship between the created primitive and the existing object. The system 100 then creates the primitive including mates (516). Then, the system 100 enables the user to create a custom tool to recreate the primitive (518). The system then automatically prompts the user to create an additional primitive (520), for example, by immediately selecting another sketch plane. The system determines whether the user input is to create an additional primitive (522) and if so, automatically prompts the user for a sketch plane (504). If the input is not to create an additional primitive (522), for example, by the user selecting another tool, entering a certain input, or selecting a cancel command option, the system 100 ends (524).

The system 100 then ends the process, allowing the user to create another primitive (520).

Figure 6:
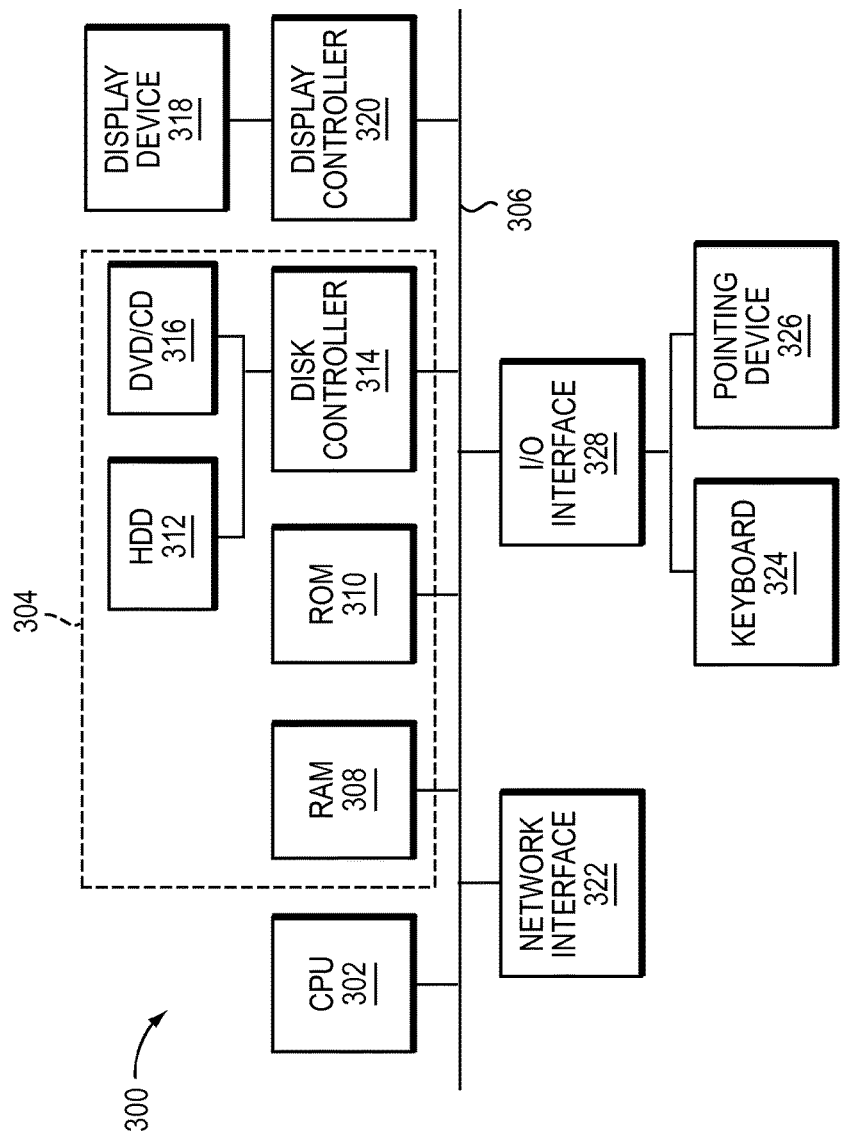
FIGS. 6 and 7 are schematic views of a computer system employing the present invention.

FIG. 6 is a schematic block diagram of an exemplary computer-aided design station 300, which may also be referred to herein as a computer system. As used herein, the terms "computer-aided design station" and "computer system" refer generally to any suitable computing device that may be used to perform the processes described above and/or any additional processes that may be related to those described above.

In an exemplary embodiment, the computer-aided design station 300 includes one or more processors 302 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 304 that is operably and/or communicatively coupled to the processor 302 by a system bus 306. A "memory area," as used herein, refers generally to any means of storing program code and instructions executable by one or more processors to aid in automatically determining or validating completeness of end-item sets using a complete-set validation engine or process. The memory area 304 may include one, or more than one, forms of memory. For example, the memory area 304 may include random-access memory (RAM) 308, which can include non-volatile RAM, magnetic RAM, ferroelectric RAM, and/or other forms of RAM. The memory area 304 may also include read-only memory (ROM) 310 and/or flash memory and/or electrically-erasable programmable read-only memory (EEPROM). Any other suitable magnetic, optical, and/or semiconductor memory, such as a hard-disk drive (HDD) 312, by itself or in combination with other forms of memory, may be included in the memory area 304. HDD 312 may also be coupled to a disk controller 314 for use in transmitting and receiving messages to and from processor 302. Moreover, the memory area 304 may also be, or may include, a detachable or removable memory 316, such as a suitable cartridge disk, CD-ROM, DVD, or USB memory. The above examples are exemplary only and, thus, are not intended to limit in any way the definition and/or meaning of the term "memory area."

The computer-aided design station 300 also includes a display device 318 that is coupled, such as operably coupled, to a display controller 320. The display controller 320 receives data via the system bus 306 for display by the display device 318. The display device 318 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 318 may include a touchscreen with an associated touchscreen controller. The above examples are exemplary only and, thus, are not intended to limit in any way the definition and/or meaning of the term "display device."

In addition, the computer-aided design station 300 includes a network interface 322 for use in communicating with a network (not shown in FIG. 6). Moreover, the computer-aided design station 300 includes one or more input devices, such as a keyboard 324 and/or a pointing device 326, such as a roller ball, mouse, touchpad, and the like. The input devices are coupled to and controlled by an input/output (I/O) interface 328, which is further coupled to the system bus 306.

A description of the general features and functionality of the display device 318, keyboard 324, pointing device 326, as well as the display controller 320, disk controller 314, network interface 322, and I/O interface 328 is omitted herein for brevity as these features are known.

Figure 7:
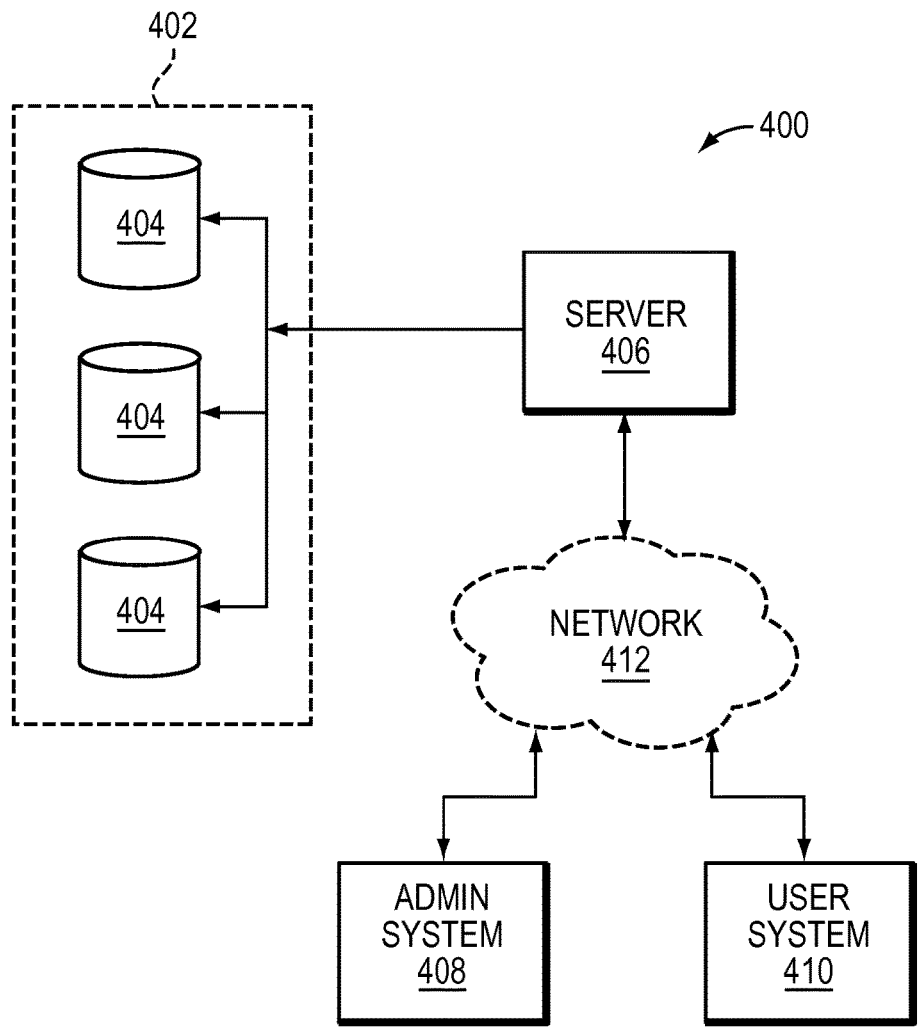

FIG. 7 is a schematic block diagram of an exemplary system 400 for use in computer-aided design of a modeled object, such as automatic mating, sketch plane inferences, primitives, tombstone tool, link/slot tool, and other primitive tools, described above and/or additional processes that may be related to those described above. In an exemplary embodiment, a memory area 402 includes one or more storage devices 404 for use in storing PLM data, such as product item 13 data, end-item 17 data, BOM 23 data and/or complete set validation procedure and/or set completion engine 100. Memory area 402 represents a BOM 23 in a tree-based graph structure as a hierarchy of product-items, subassemblies, child parts and end-items for constructing products in a given set. In some embodiments, the tree-based graph structure is an acyclic directed graph structure.

In some embodiments, the memory area 402 is coupled to a server 406, which is in turn coupled to an administrator system 408 and/or a user system 410 via a network 412. The storage devices 404 may be embodied as one or more databases, may be located at a single or at multiple geographical sites, or may be integrated with the server 406.

As can be appreciated, the network 412 can be a public network, such as the Internet, or a private network such as an LAN or WAN network, or any combination thereof and can also include PSTN or ISDN sub-networks. The network 412 can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network 412 is merely exemplary and in no way limits the scope of the present advancements.

As one of ordinary skill in the art would recognize, the administrator system 408 and/or the user system 410 can be a computer-aided design station such as the one described above with reference to FIG. 6, or any other computing system that is known. Moreover, it should be understood that the administrator system 408 and/or the user system 410 are configured to perform the processes described above and/or any additional processes that may be related to those described above.

The server 406 stores the computer-readable instructions to execute the processes 100 (FIG. 8) described above and provides these instructions via the network 412 to the administrator system 408 and/or the user system 410. Moreover, the server 406 can also provide data from the memory area 402 as needed to the administrator system 408 and the user system 410. As such, FIG. 7 includes implementations of the system 400 via cloud computing, distributed computing and the like.

Exemplary embodiments of systems, methods, apparatus, computer program products, and non-transitory computer-readable storage media for use in product life cycle management and computer-aided design of a modeled object and product portfolio are described above in detail. The systems, methods, apparatus, computer program products, and computer-readable storage media are not limited to the specific embodiments described herein but, rather, operations of the methods, program products and/or storage media, as well as components of the system and/or apparatus, may be utilized independently and separately from other operations and/or components described herein. Further, the described operations and/or components may also be defined in, or used in combination with, other systems, methods, apparatus, program products and/or storage media, and are not limited to practice with only the systems, methods, apparatus, program products and storage media as described herein.

A computer or computer system, such as those described herein, includes at least one processor or processing unit and a system memory. The computer or computer system typically has at least some form of non-transitory computer readable media. By way of example and not limitation, non-transitory computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of well known computer systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of non-transitory components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified.

That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented 3D modeling method comprising:
   receiving user input of definitions to create a sketch entity in a 3D model during a model creation mode, the user input definitions being automatically provided to the model creation mode and a model simulation mode as a single input using a single command;
   generating the sketch entity in the 3D model in the model creation mode based on the user input definitions; and
   using the user input definitions in the model simulation mode to simulate the 3D model, such that the user input definitions are used in both the model creation mode and the model simulation mode from the single input by a user and avoiding requiring the user to invoke a separate command from the single command in the model simulation mode to input corresponding definitions, the model creation mode being a separate operational mode from the model simulation mode of operation.

2. The method of claim 1 wherein using the user input definitions in the model simulation mode includes inferring model simulation definitions from the user input definitions.

3. The method of claim 2 further comprising inferring a work plane during the model creation mode from a pointer location to create the sketch entity.

4. The method of claim 3, further comprising inferring an input to an extrusion operation from a subsequent pointer location after the sketch entity is created.

5. The method of claim 3, further comprising inferring at least one input to an add feature operation from at least one subsequent pointer location after the sketch entity is created.

6. The method of claim 5, wherein the add feature operation is one of an extrusion, a revolve, a sweep, a loft, a thickening of a surface, or a sheet metal flange.

7. The method of claim 1, wherein a feature is added to at least two sketch entities of the 3D model to create at least two 3D-parts, each 3D-part corresponding to the at least two sketch entities, and further comprising:
   receiving user input of selections of the at least two 3D-parts based on the selections; and
   automatically aligning and creating a mating relationship between the selected at least two 3D-parts.

8. The method of claim 7, wherein automatically aligning and creating a mating relationship infers the mating relationship based on at least one feature of the respective at least two 3D-parts.

9. The method of claim 1, further comprising:
   enabling a tool configured to create the 3D-part based on a history of the 3D-part;
   wherein the tool accepts user input to create the 3D-part corresponding to the history of the 3D-part.

10. A computer system for 3D-modeling, the system comprising:
    one or more computer processors;
    a user interface module executed by one of the processors and configured to receive user input of definitions to create a sketch entity in a 3D model during a model creation mode, the user interface module providing the user input definitions to the model creation mode and a model simulation mode as a single input using a single command;
    a sketch entity generation module executed by one of the processors and configured to generate the sketch entity in the 3D model in the model creation mode based on the user input definitions; and
    two modes of operation of the one or more processors that are presented as a single mode to the user to input definitions to simulate the 3D model, such that the user input definitions are used in both the model creation mode and the model simulation mode from the single input by a user and avoiding requiring the user to invoke a separate command from the single command in the model simulation mode to input corresponding definitions, the model creation mode being a separate operational mode from model simulation mode of operation.

11. The system of claim 10 wherein the single mode is further configured to infer model simulation definitions from the user input definitions.

12. The system of claim 11 wherein the sketch entity generation module is further configured to infer a work plane during the model creation mode from a pointer location to create the sketch entity.

13. The system of claim 12, further comprising a part generation module executed by one of the processors and configured to infer an input to an extrusion operation from a subsequent pointer location after the sketch entity is created.

14. The system of claim 12, further comprising a part generation module executed by one of the processors and configured to infer at least one input to an add feature operation from at least one subsequent pointer location after the sketch entity is created.

15. The system of claim 14, wherein the add feature operation is one of an extrusion, a revolve, a sweep, a loft, a thickening of a surface, or a sheet metal flange.

16. The system of claim 10, wherein a feature is added to at least two sketch entities of the 3D model to create at least two 3D-parts, each 3D-part corresponding to the at least two sketch entities, the user input module is further configured to receive user input of selections of the at least two 3D-parts, and further comprising:

a mating module executed by one of the processors and configured to automatically align the at least-two 3D-parts based on the selections and create a mating relationship between the selected at least two 3D-parts.

17. The system of claim 16, wherein the mating module is further configured to infer the mating relationship based on at least one feature of the respective at least two 3D-parts.

18. The system of claim 10, wherein the user interface module is further configured to enable a tool configured to create the 3D-part based on a history of the 3D-part;

wherein the tool accepts user input to create the 3D-part corresponding to the history of the 3D-part.

19. A non-transitory computer-readable medium configured to store instructions for creating a 3D-part within a computer aided design (CAD) three-dimensional (3D)-assembly, the instructions, when loaded and executed by a processor, causes the processor to:

receive user input of definitions to create a sketch entity in a 3D model during a model creation mode, the user input definitions being automatically provided to the model creation mode and a model simulation mode in a single input using a single command;

generate the sketch entity in the 3D model in the model creation mode based on the user input definitions; and use the user input definitions in the model simulation mode to simulate the 3D model, such that the user input definitions are used in both the model creation mode and the model simulation mode from the single input by a user and avoiding requiring the user to invoke a separate command from the single command in the model simulation mode to input corresponding definitions, the model creation mode being a separate operational mode from model simulation mode of operation.

20. The non-transitory computer-readable medium of claim 19, wherein using the user input definitions in the model simulation mode includes inferring model simulation definitions from the user input definitions.

\* \* \* \* \*